United States Patent
Adam et al.

(10) Patent No.: US 9,728,649 B2
(45) Date of Patent: Aug. 8, 2017

(54) SEMICONDUCTOR DEVICE INCLUDING EMBEDDED CRYSTALLINE BACK-GATE BIAS PLANES, RELATED DESIGN STRUCTURE AND METHOD OF FABRICATION

(71) Applicant: GLOBALFOUNDRIES Inc., Grand Cayman (KY)

(72) Inventors: Thomas N. Adam, Slingerlands, NY (US); Kangguo Cheng, Schenectady, NY (US); Ali Khakifirooz, Mountain View, CA (US); Alexander Reznicek, Troy, NY (US); Raghavasimhan Sreenivasan, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/009,906

(22) Filed: Jan. 29, 2016

(65) Prior Publication Data

US 2016/0163879 A1    Jun. 9, 2016

Related U.S. Application Data

(62) Division of application No. 13/900,808, filed on May 23, 2013, now Pat. No. 9,281,198.

(51) Int. Cl.
| | |
|---|---|
| *H01L 29/786* | (2006.01) |
| *H01L 21/28* | (2006.01) |
| *H01L 21/84* | (2006.01) |
| *H01L 27/12* | (2006.01) |

(Continued)

(52) U.S. Cl.
CPC .. *H01L 29/78648* (2013.01); *H01L 21/28008* (2013.01); *H01L 21/84* (2013.01); *H01L 27/1203* (2013.01); *H01L 29/0649* (2013.01); *H01L 29/42364* (2013.01)

(58) Field of Classification Search
CPC ......... H01L 29/78648; H01L 21/28008; H01L 21/84; H01L 27/1203
See application file for complete search history.

(56) References Cited

U.S. PATENT DOCUMENTS

| | | | |
|---|---|---|---|
| 6,043,535 A | 3/2000 | Houston | |
| 6,580,132 B1 * | 6/2003 | Chan | H01L 29/4908 257/347 |
| 6,610,548 B1 | 8/2003 | Ami et al. | |

(Continued)

OTHER PUBLICATIONS

Tyler et al., "Buried-Line Back-Gated Triode Field Emission Devices", IEEE, 2006, 2 pages.

(Continued)

*Primary Examiner* — Tucker J Wright
(74) *Attorney, Agent, or Firm* — David Cain; Hoffman Warnick LLC

(57) ABSTRACT

A semiconductor device is disclosed. The semiconductor device can include a first dielectric layer disposed on a substrate; a set of bias lines disposed on the first dielectric layer; a second dielectric layer disposed on the first dielectric layer and between the set of bias lines, wherein a thickness of the second dielectric layer is less than a thickness of the first dielectric layer; a patterned semiconductor layer disposed on portions of the second dielectric layer; and a set of devices disposed on the patterned semiconductor layer above the set of bias lines.

17 Claims, 11 Drawing Sheets

(51) Int. Cl.
*H01L 29/06* (2006.01)
*H01L 29/423* (2006.01)

(56) References Cited

U.S. PATENT DOCUMENTS

| | | | |
|---|---|---|---|
| 6,630,384 B1 * | 10/2003 | Sun | H01L 27/11568 257/E21.679 |
| 6,632,723 B2 | 10/2003 | Watanabe et al. | |
| 6,852,575 B2 | 2/2005 | Bojarczuk, Jr. et al. | |
| 7,135,699 B1 | 11/2006 | Atanackovic | |
| 7,453,123 B2 | 11/2008 | Dokumaci et al. | |
| 7,767,546 B1 | 8/2010 | Dennard et al. | |
| 7,821,066 B2 | 10/2010 | Lebby et al. | |
| 7,911,003 B2 | 3/2011 | Takeuchi | |
| 2003/0113961 A1 | 6/2003 | Horiuchi et al. | |
| 2003/0136331 A1 | 7/2003 | Ami et al. | |
| 2003/0201492 A1 | 10/2003 | Ravi | |
| 2004/0094758 A1 | 5/2004 | Usuda et al. | |
| 2004/0152272 A1 | 8/2004 | Fladre et al. | |
| 2004/0222471 A1 | 11/2004 | Inoh | |
| 2006/0113603 A1 | 6/2006 | Currie | |
| 2006/0118871 A1 | 6/2006 | Kato | |
| 2006/0208313 A1 | 9/2006 | Atanackovic | |
| 2006/0231873 A1 | 10/2006 | Anderson et al. | |
| 2007/0020837 A1 * | 1/2007 | Bryant | H01L 21/84 438/199 |
| 2007/0120200 A1 * | 5/2007 | Yun | H01L 29/66772 257/401 |
| 2007/0138533 A1 * | 6/2007 | Dennard | H01L 27/1108 257/314 |
| 2007/0187719 A1 | 8/2007 | Yuan et al. | |
| 2010/0176453 A1 | 7/2010 | Dennard et al. | |
| 2010/0187607 A1 | 7/2010 | Dennard et al. | |
| 2011/0127608 A1 | 6/2011 | Cheng et al. | |
| 2011/0133280 A1 | 6/2011 | Bangsaruntip et al. | |
| 2011/0187412 A1 | 8/2011 | Ma et al. | |
| 2012/0104495 A1 | 5/2012 | Zhu et al. | |
| 2014/0145312 A1 * | 5/2014 | Wang | H01L 29/02 257/632 |

OTHER PUBLICATIONS

Fulk, Office Action Communication for U.S. Appl. No. 13/900,808 dated Feb. 10, 2015, 22 pages.
Wright, Notice of Allowance and Fee(s) Due for U.S. Appl. No. 13/900,808 dated Oct. 29, 2015, 8 pages.
Fulk, Office Action Communication for U.S. Appl. No. 13/900,808 dated May 13, 2015, 18 pages.

* cited by examiner

US 9,728,649 B2

SEMICONDUCTOR DEVICE INCLUDING EMBEDDED CRYSTALLINE BACK-GATE BIAS PLANES, RELATED DESIGN STRUCTURE AND METHOD OF FABRICATION

PRIORITY

This application claims priority to previous U.S. patent application Ser. No. 13/900,808 filed May 23, 2013, which is hereby incorporated by reference.

FIELD OF THE INVENTION

Embodiments of this disclosure relate generally to semiconductor devices and, more particularly, to back-gate bias lines/planes in semiconductor device design, layout, and related methods of fabrication.

BACKGROUND

In the fabrication of integrated circuit (IC) devices (also referred to as semiconductor devices), many processes, steps, and techniques may be applied to form components and materials into the desired products. For example, in the fabrication of extremely thin silicon-on-insulator (ETSOI) devices, back-gate biases may be desired to tune device characteristics, manage power consumption, etc. Fabrication of these devices typically includes application of back-gate biases across a buried oxide (BOX) layer. However, in order to make the application of this back-gate bias across thick BOX layers effective, a large back bias voltage is required. Typically, the large back bias voltage is not practical with modern low operating voltage chips. As a result, this application limitation may require the use of ultra-thin body BOX (UTBB) technologies during fabrication. The requiring of the UTBB technologies during fabrication may increase cost, as well as increase design and process complexity.

BRIEF SUMMARY

A first aspect of the disclosure provides a method of forming a semiconductor device, the method including: forming a first dielectric layer on a substrate; forming a set of bias lines on the first dielectric layer; covering the set of bias lines with a second dielectric layer; forming a semiconductor layer on the second dielectric layer; and forming a set of devices on the semiconductor layer above the set of bias lines.

A second aspect of the disclosure provides a method of forming a backgate substrate, the method including: forming a first dielectric layer on a substrate, wherein the first dielectric layer includes a rare earth oxide (REO); forming a set of bias lines on the first dielectric layer, the set of bias lines including a first bias line with a first back-gate bias and a second bias line with a second back-gate bias; covering the set of bias line with a second dielectric layer; forming a third dielectric layer on the second dielectric layer; forming a semiconductor layer on the third dielectric layer; and forming a set of devices on the semiconductor layer above the set of bias lines, the set of devices including a first transistor disposed above the first bias line and a second transistor disposed above the second bias line.

A third aspect of the disclosure provides a semiconductor device including: a first dielectric layer disposed on a substrate; a set of bias lines disposed on the first dielectric layer; a second dielectric layer disposed on the first dielectric layer and between the set of bias lines; a patterned semiconductor layer disposed on portions of the second dielectric layer; and a set of devices disposed on the patterned semiconductor layer above the set of bias lines.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

It is noted that the drawings of the disclosure are not necessarily to scale. The drawings are intended to depict only typical aspects of the disclosure, and therefore should not be considered as limiting the scope of the disclosure. It is understood that elements similarly numbered between the FIGURES may be substantially similar as described with reference to one another. Further, in embodiments shown and described with reference to FIGS. 1-20, like numbering may represent like elements. Redundant explanation of these elements has been omitted for clarity. Finally, it is understood that the components of FIGS. 1-20 and their accompanying descriptions may be applied to any embodiment described herein.

DETAILED DESCRIPTION

Figure 1:
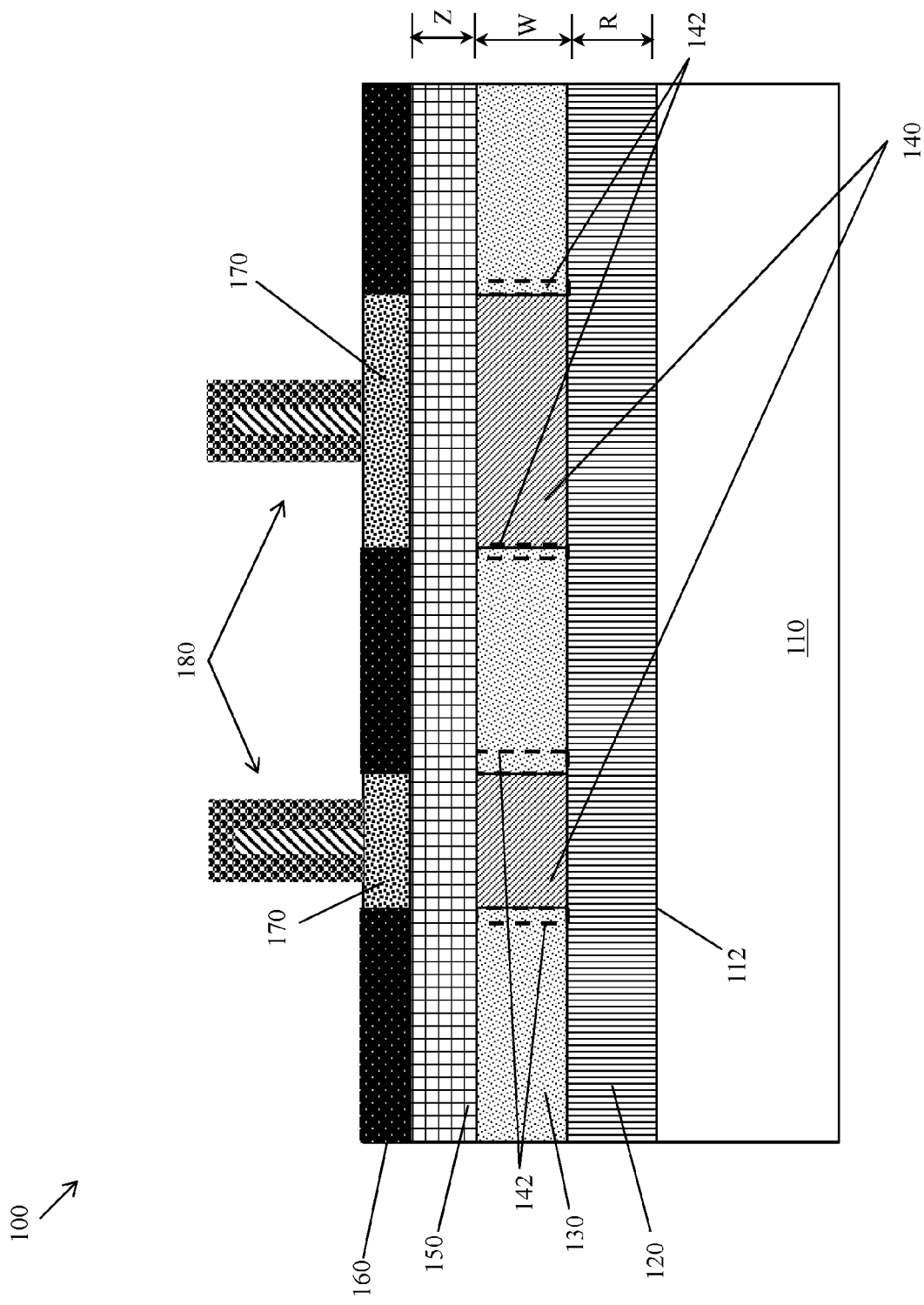
FIG. 1 is an illustration of a portion of a semiconductor device.

FIG. 1 is an illustration of a cross sectional view of a portion of a semiconductor device 100 including a set of pre-patterned bias lines 140 shown according to embodiments. In an embodiment, semiconductor device 100 may include a substrate 110 with a first crystalline dielectric layer 120 (e.g., a crystalline oxide layer, a backgate dielectric layer, an epitaxially grown crystalline oxide layer, a rare earth oxide layer, etc.) disposed on a substrate surface 112 of substrate 110. In an embodiment, first layer 120 may be deposited on substrate surface 112 (e.g., a top surface) of substrate 110 and may have a thickness 'R' of about 10 nanometers to about 500 nanometers. In one embodiment, first layer 120 may have a thickness 'R' of about 10 nanometers to about 100 nanometers. Semiconductor device 100 may further include a second crystalline dielectric layer 130 disposed on first layer 120 and between a set of back-gate bias lines 140. Second layer 130 may have a thickness 'W' of about 5 nanometers to about 500 nanometers. In one embodiment, second layer 130 may have a thickness 'W' of about 10 nanometers to about 30 nanometers. Set of back-gate bias lines 140 may be disposed within second layer 130 and may include silicon, a highly doped silicon layer, an epitaxially grown silicon layer, and/or any semiconductor material which may be deposited on first layer 120 (e.g., an epitaxial oxide). In an embodiment, a set of thermal oxide liners 142 (shown in phantom) may be disposed between set of back gate bias lines 140 and second layer 130. A third crystalline dielectric layer 150 may be disposed on second layer 130 and set of back-gate bias lines 140. In an embodiment, third layer 150 may have a thickness 'Z' of about 5 nanometers to about 500 nanometers. In one embodiment, third layer 150 may have a thickness 'Z' of about 10 nanometers to about 30 nanometers. Layers 120, 130, and 150 may include the same or differing materials and compositions.

As shown in FIG. 1, a semiconductor layer 170 (e.g., silicon) may be disposed substantially above and/or substantially aligned with set of back-gate bias lines 140 on third layer 150 and between a set of shallow trench isolations (STI) 160. A set of devices (e.g., gates, transistors, field effect transistors (FET), etc.) 180 may be disposed on semiconductor layer 170 above set of back-gate bias lines 140. In an embodiment, layers 120, 130, and 150 may allow for back-gate bias control. That is, layers 120, 130, and 150 may allow for maintaining the lattice information between underlying substrate 110 and layers and/or devices formed thereon.

Substrate 110 may be made from any known semiconductor materials including but not limited to, for example, silicon, germanium, silicon-germanium alloy, silicon carbide, and compound (e.g. III-V and II-VI) semiconductor materials. Non-limiting examples of compound semiconductor materials include gallium arsenide, indium arsenide, and indium phosphide. Typically substrate 110 may be about, but is not limited to, several hundred microns thickness. For example, substrate 110 may include a thickness ranging from about 0.5 mm to about 1.5 mm. In some embodiments, substrate 110 may consist essentially of one or more Group III-V compound semiconductors having a composition defined by the formula $Al_{X1}Ga_{X2}In_{X3}As_{Y1}P_{Y3}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 110 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 110, as illustrated and described, are well known in the art and thus, no further description is necessary. It is understood that while examples described herein and in the figures are directed toward silicon semiconductor devices, these structures and/or material compositions are merely exemplary, and that the structures and processes described herein may be applied to any semiconductor device or material composition now known or later developed.

In an embodiment, at least one of first layer 120 or second layer 130 may be formed by epitaxial growth. Second layer 130 may be formed by epitaxial growth on top of first layer 120 (e.g., an epitaxial oxide layer, an REO layer, etc.). Layers 120, 130, and/or 150 (e.g., crystalline oxides, back-gate dielectric layers, etc.) may be formed of an epitaxial oxide grown on below layers of semiconductor device 100 and may include a rare earth oxide (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$)). In one embodiment, layers 120, 130, and/or 150 may include combinations of rare earth oxides (e.g., a material such as $ABO_3$, where 'A' and 'B' may be any rare earth metal (e.g., lanthanum scandium oxide ($LaScO_3$)).

In one embodiment, layers 120, 130, and/or 150, may include Perovskites (e.g. strontium titanate ($SrTiO_3$) or barium titanate ($BaTiO_3$)). In yet another embodiment, layers 120, 130, and/or 150, may include aluminum oxide $Al_2O_3$ or aluminum oxide compounds (e.g., lanthanum aluminum $LaAlO_3$) which may be deposited by pulsed laser deposition (PLD). It is understood that the description of layers (e.g., crystalline dielectric layers) described herein are for illustrative purposes, and that any number, orientation, configuration, or combination of crystalline dielectric layers may be used in accordance with embodiments of the invention.

In an embodiment, semiconductor layer 170 may be undoped and may be formed by epitaxial growth on top of third layer 150. Besides silicon, other semiconductor materials such as germanium, silicon germanium, GeSn, III-V compound semiconductor, II-VI compound semiconductor materials may also be included in semiconductor layer 170. In an embodiment, semiconductor layer 170 may be doped or un-doped and may include: silicon, germanium, silicon-germanium alloy, and/or carbon doped silicon (Si:C). In one embodiment, semiconductor layer 170 may include carbon doped silicon with an atomic carbon concentration of between about 0.2 to about 4.0% substitutional carbon. In one embodiment, semiconductor layer 170 may include a carbon doped silicon type material having a concentration of about 0.3 to about 2.5% substitutional Carbon. It is understood that the total amount of carbon in semiconductor layer 170 may be higher than the substitutional amount. In a preferred exemplary embodiment, semiconductor layer 170 may include silicon, germanium, silicon germanium, carbon doped silicon, a silicon-germanium alloy, and compound (e.g. III-V and II-VI) semiconductor materials etc. In an embodiment, carbon doped silicon may include a concentration of substitutional Carbon (C) of about 0.4 to about 2.5%. Si:C.

FIGS. 2-18 are illustrations of a device undergoing a method according to embodiments of the invention. Although FIGS. 2-18 show the method of forming a portion of a semiconductor device 100 shown in FIGS. 1 and 18, it is understood that a similar method may be employed to form any other like semiconductor device.

Figure 2:
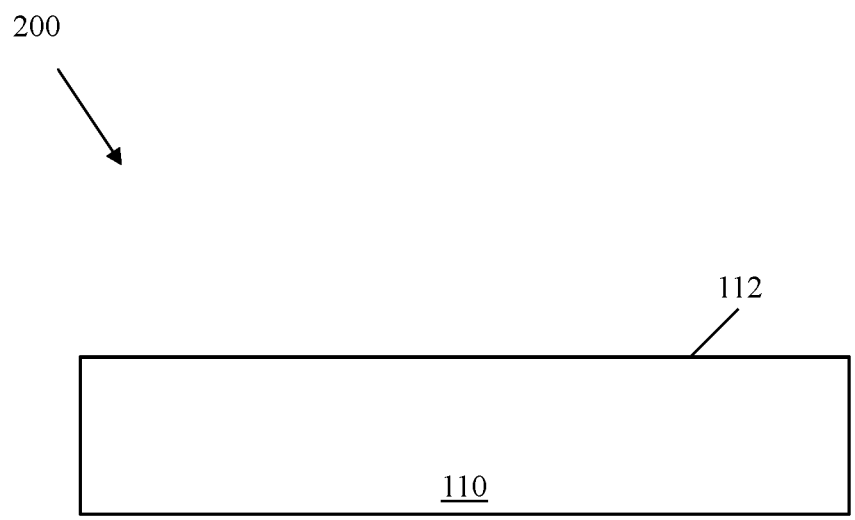
FIGS. 2-18 are illustrations of a method of forming a semiconductor device according to embodiments of the invention.

Turning to FIG. 2, an illustration of a cross sectional view of a portion of a semiconductor device 200 including a substrate 110 is shown according to embodiments. In this embodiment, substrate 110 includes a substrate surface 112 for deposition and/or formation of regions, devices, and/or layers as described herein. The processes to provide substrate 110, as illustrated and described, are well known in the art and thus, no further description is necessary.

Figure 3:
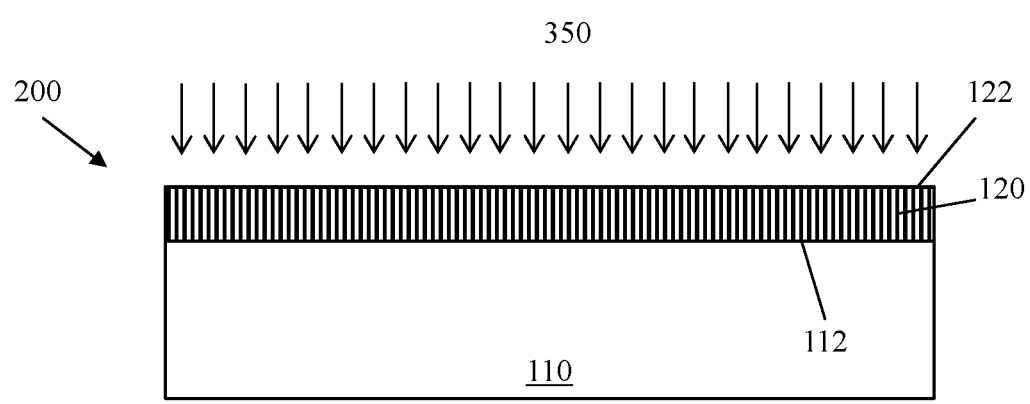

Turning to FIG. 3, an illustration of a cross sectional view of a portion of semiconductor device 200 is shown undergoing formation 350 of first layer 120 on substrate 110 according to embodiments. In an embodiment, formation 350 may include epitaxial growth of first layer 120 (e.g., an epitaxial oxide) on surface 112 of substrate 110. First layer 120 may be crystalline and may include a rare earth oxide (REO) as described herein. First layer 120 may be formed directly on substrate surface 112 of substrate 110 and may define a first oxide surface 122 located substantially opposite and/or parallel relative to substrate surface 112. First layer 120 may be formed as a buried oxide (BOX) layer (e.g., an oxide layer disposed between semiconductor layers) as shown/described in embodiments herein. In one embodiment, substrate 110 may be subjected to an epitaxial growth process on substrate surface 112 to form first layer 120 on substrate 110 (e.g., first layer 120 may be epitaxially grown).

In one embodiment, REO in first layer 120 may substantially cover substrate surface 112, maintaining the lattice information between underlying substrate 110 and layers and/or devices formed thereon. It is understood that embodiments that are described herein with reference to specific substrates, regions, and layer orientations/compositions are for exemplary purposes, and that any combination of layers (e.g., oxide and nitride layers and configurations), implants, substrate modifications and/or trench placements may be included as an embodiment of the invention. The implants, regions, trenches, and/or layers described herein may be formed in substrates and/or layers which are substantially similar and/or different to those described and shown in FIGS. 1-18.

Figure 4:
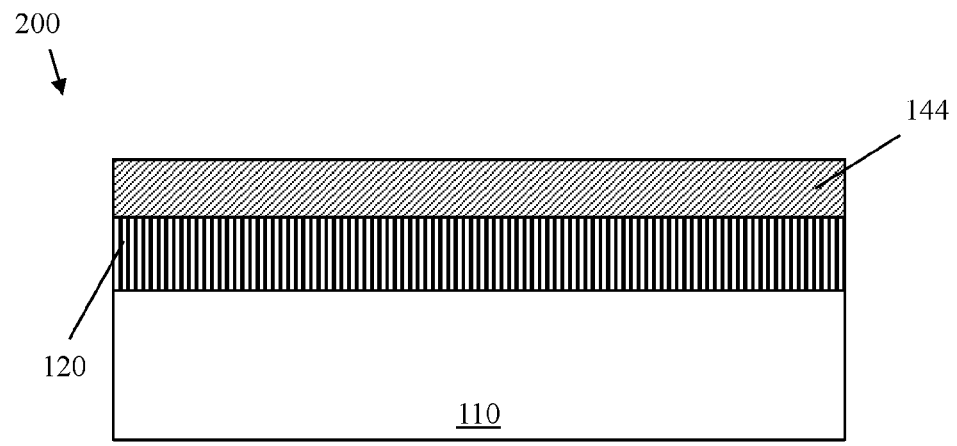
Figure 5:
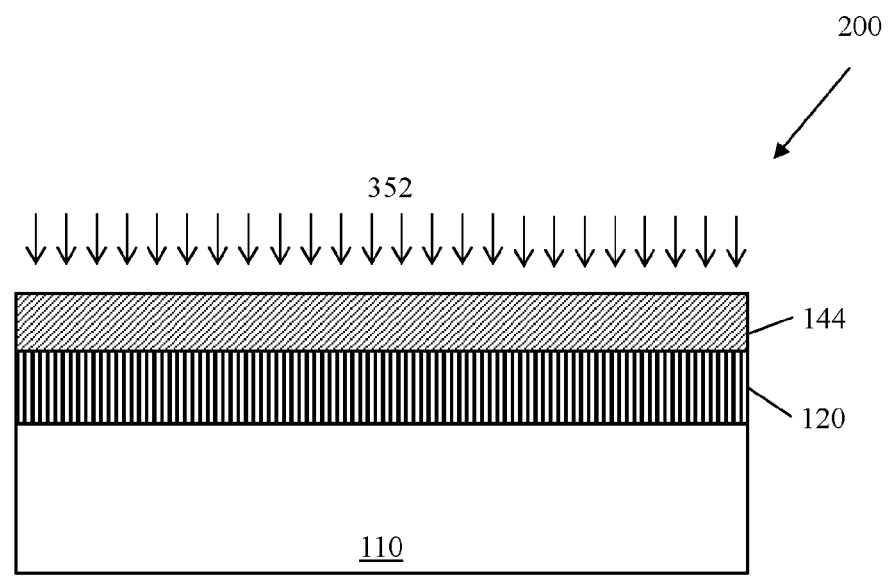

Turning to FIG. 4, an illustration of a device layer 144 (e.g., silicon) being disposed on first layer 120 is shown according to embodiments. Device layer 144 may deposited and/or grown on first layer 120 and may include highly doped silicon. In an embodiment, device layer 144 may include materials consistent with set of back-gate bias lines 140 (shown in FIG. 1). Next, in FIG. 5, an illustration of device layer 144 being subjected to a forming process 352 (e.g., pattern and etch, etc.) to form/shape set of back-gate bias lines 140 (e.g., silicon lines) is shown in accordance with embodiments. Process 352 may selectively remove/etch portions of device layer 144 to first layer 120, forming/shaping set of back-gate bias lines 140. In one embodiment, process 352 may include a common mask and etch process as is known.

Figure 6:
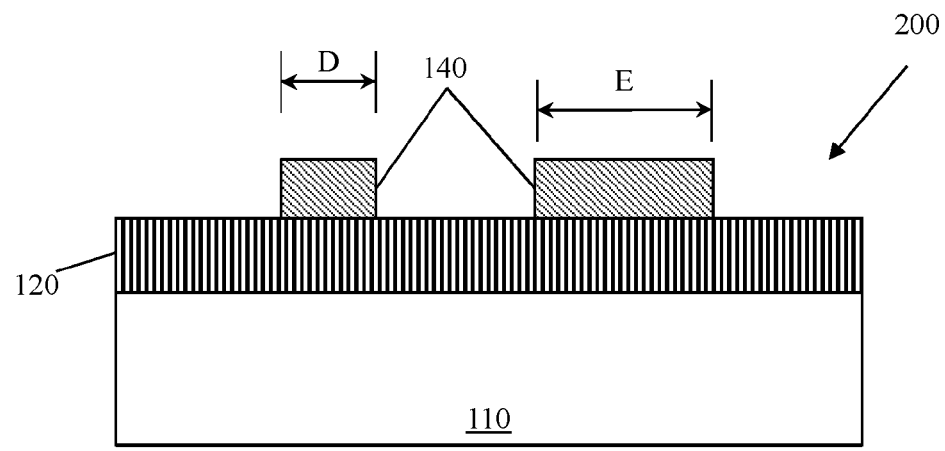
Figure 7:
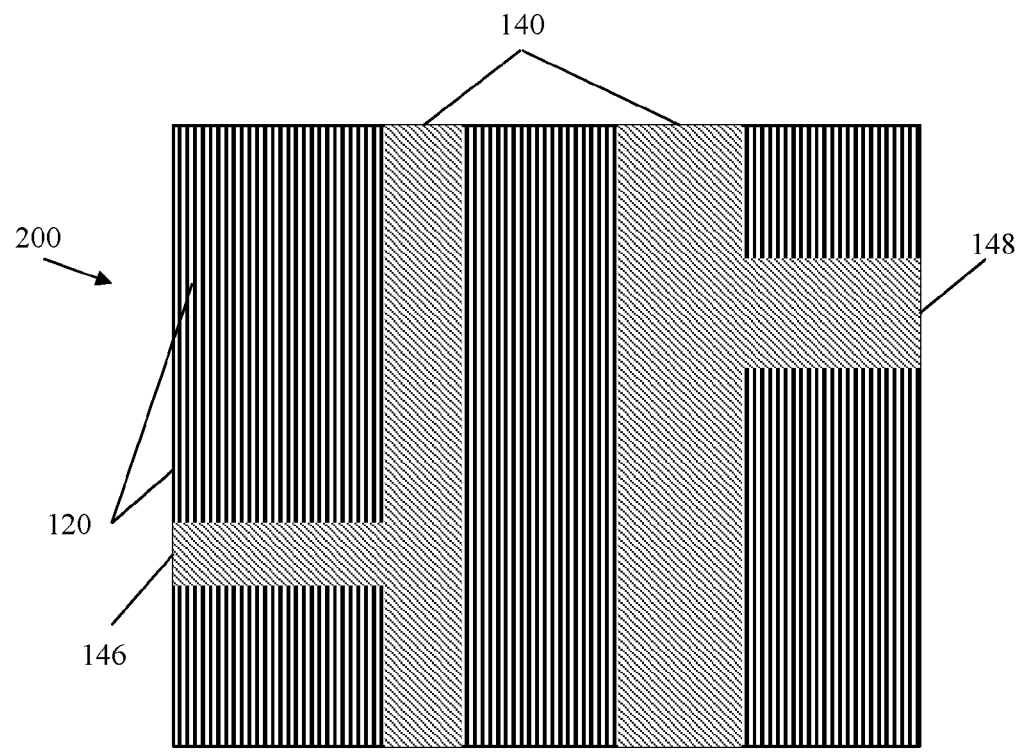

As can be seen in FIGS. 6 and 7, forming process 352 may form any number, shape, and/or configuration of set of back-gate bias lines on first layer 120. In FIG. 6, an illustration of a cross-sectional view of semiconductor device 200 following process 352 is shown according to embodiments. In an embodiment, process 352 may form device layer 144 (shown in FIGS. 4-5) into a set of back-gate bias lines 140 which may include varied dimensions 'D' and 'E' relative to one another. Further, in FIG. 7, an illustration of top view of semiconductor device 100 following process 352 is shown according to embodiments. As can be seen, back-gate bias lines 140 may be formed in any shape including a first contact region 146 and a second contact region 148 which may extend laterally across a surface of first layer 120/semiconductor device 200.

Figure 8:
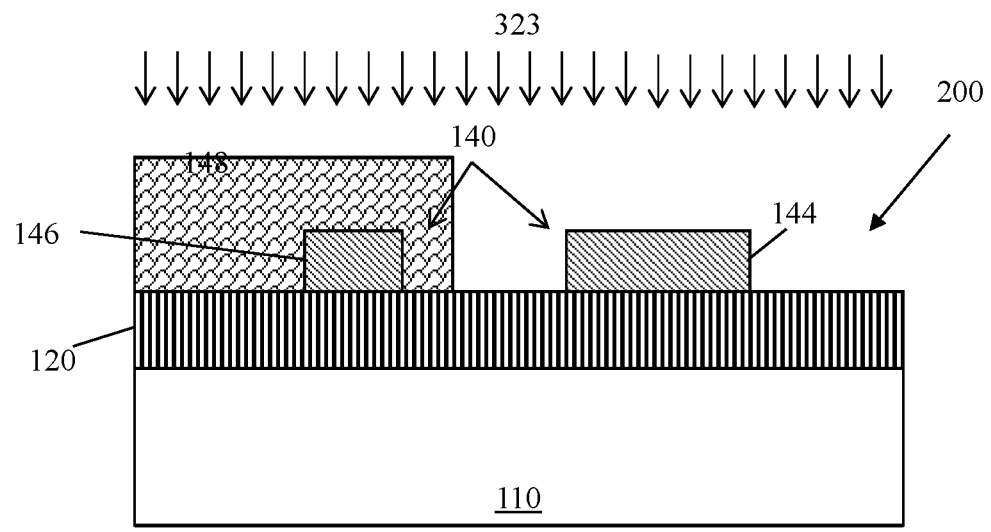
Figure 9:
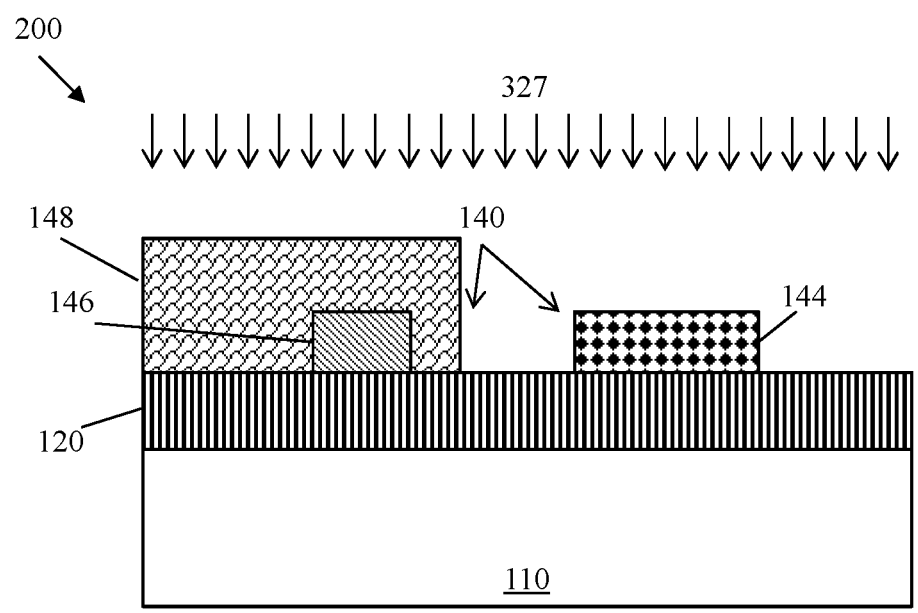
Figure 19:
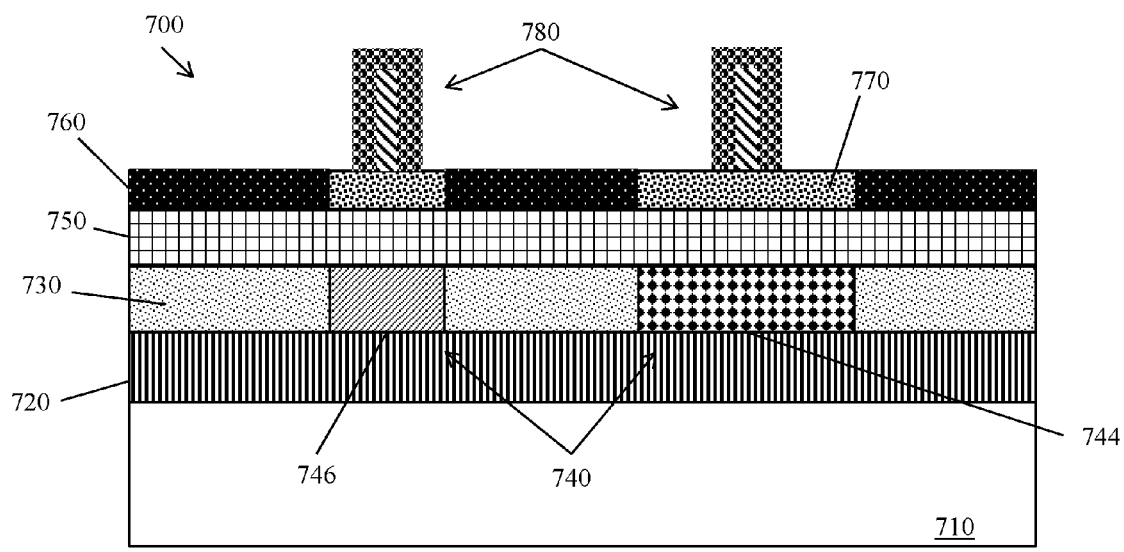
FIG. 19 is an illustration of a portion of a semiconductor device.

Turning to FIG. 8, semiconductor device 200 is shown being subjected to an optional masking process 323 according to embodiments of the invention. Masking process 323 may form a mask 148 on a first bias line 146 in set of back-gate bias lines 140 and not on a second bias line 144. Mask 148 may be formed in accordance with known mask and etch techniques and may cover portions of first bias line 146 and first layer 120 and expose portions of second bias line 144. Following formation of mask 148, as shown in the illustration of FIG. 9, a set of modification processes 327 may be performed on semiconductor device 200 in accordance with embodiments of the invention. In an embodiment, set of modification processes 327 may change/alter a material characteristic of exposed second bias line 144. In one embodiment, set of modification processes 327 may include doping (e.g., n-type doping, p-type doping, etc.) of second bias line 144. In another embodiment, set of modification processes 327 may include substitution (e.g., removal and replacement) of portions/materials of second bias line 144. In an embodiment, first bias line 146 and/or second bias line 144 may each be altered by masking process 323 and a set of modification processes 327 such that a material composition of first bias line 146 and second bias line 144 is different relative to one another, thereby producing a semiconductor device with varied bias line characteristics as shown in FIG. 19 and described further herein.

Figure 10:
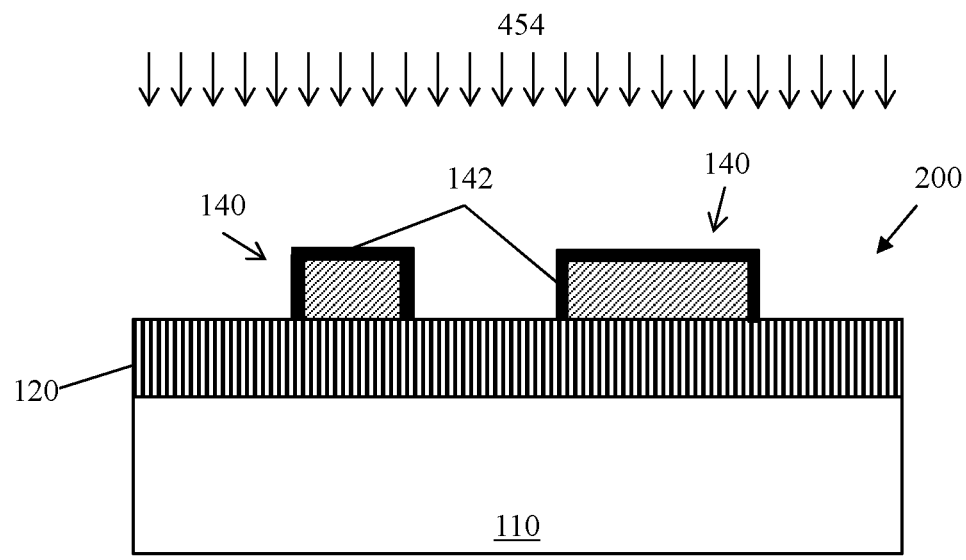
Figure 11:
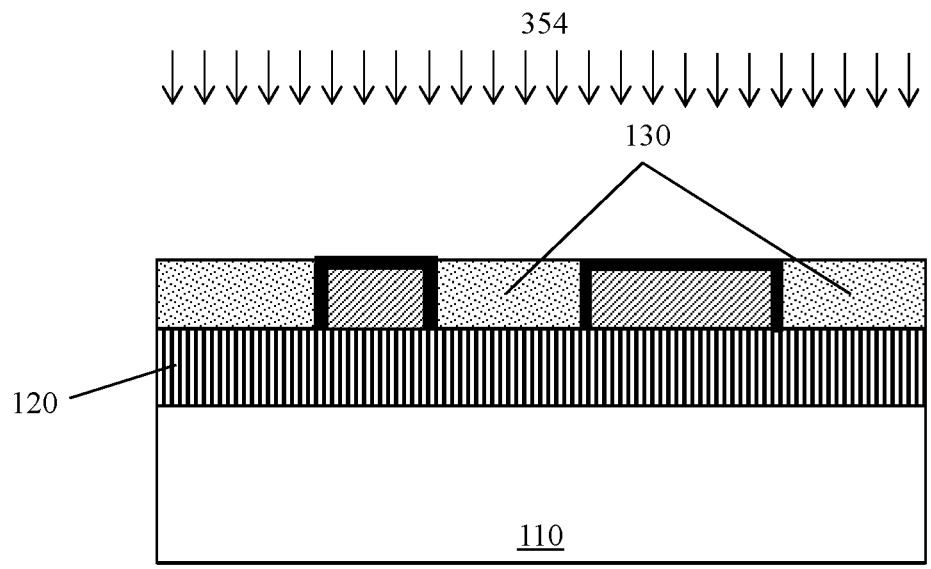

Turning to FIG. 10, an illustration of set of back-gate bias lines 140 being subjected to an optional oxidation process 454 (e.g., a thin thermal oxidation) for formation of a thin oxide layer 142 (e.g., a thermal oxide layer, an amorphous silicon oxide layer, etc.) around the set of back-gate bias lines 140 is shown according to embodiments. Next, in FIG. 11, an illustration of a formation process 354 covering the set of back-gate bias lines 140 with second layer 130 is shown according to embodiments of the invention. Formation process 354 may be non-selective or selective, and may form second layer 130 substantially between set of back-gate bias lines 140. In one embodiment, formation process 354 may include selective epitaxial growth of an epitaxial oxide on first layer 120. In another embodiment, formation process 354 may include non-selective epitaxial growth of an epitaxial oxide on first layer 120 followed by a chemical mechanical polishing. Second layer 130 and first layer 120 may include substantially similar or substantially varied material compositions. In one embodiment, first layer 120 and second layer 130 may include the same material.

Figure 12:
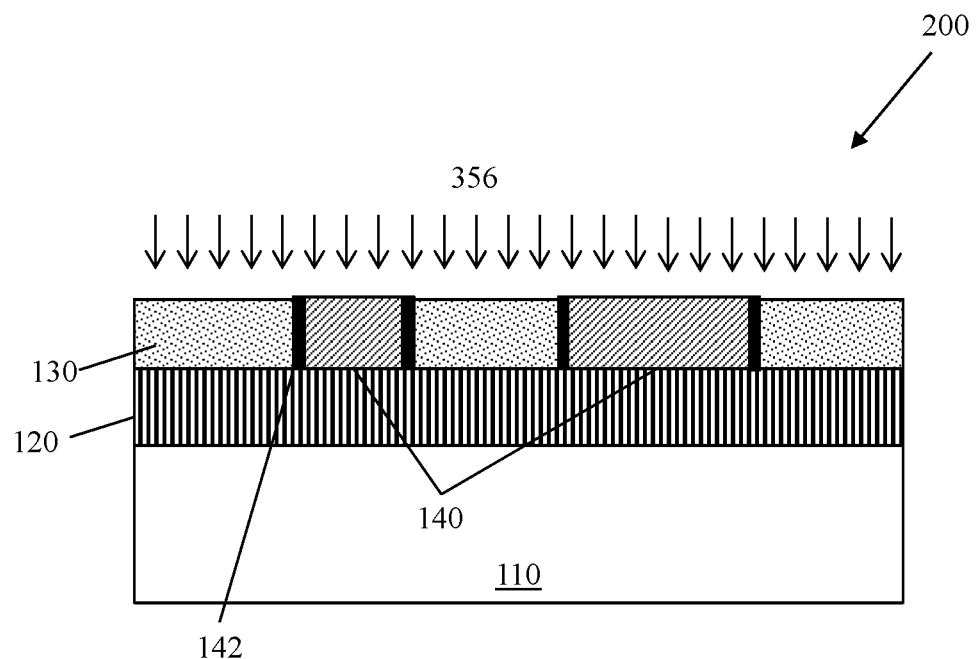

Turning to FIG. 12, an illustration of semiconductor device 200 being subjected to an optional removal process 356 (e.g., a hydro-fluoric wet etch, a dry etch, etc.) to remove thin oxide layer 142 (e.g., thin oxide layer 142 on a top surface of set of back-gate bias lines 140) is shown according to embodiments. Removal process 356 may remove exposed portions of thin oxide layer 142 (e.g., top portions not bounded by second layer 130). It is understood that addition and removal of portions of thin oxide layer 142 are illustrative and optional, and that other embodiments of the invention as shown in FIGS. 1 and 19 may be formed without these steps/inclusion of these optional spacers.

Figure 13:
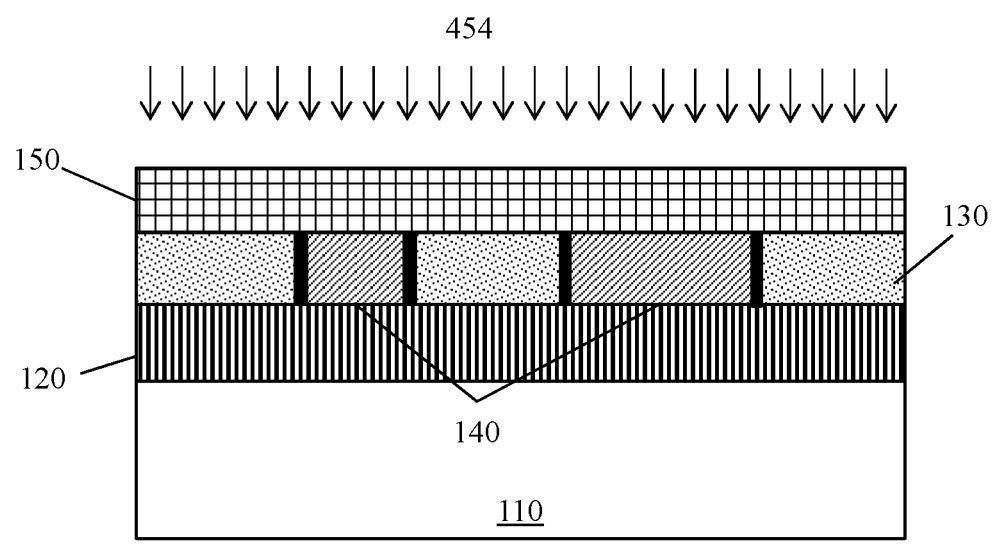

Turning to FIG. 13, an illustration of a third formation 454 of a third layer 150 on top of second layer 130 and set of back-gate bias lines 140 is shown according to embodiments of the invention. Third layer 150 may substantially cover second layer 130 and set of back-gate bias lines 140. In an embodiment, third layer 150 may be strained or not strained depending on a condition of first and second crystalline dielectric layers 120 and 130 (e.g., the lattice engineering of the REO in first and second crystalline dielectric layers 120 and 130). Third layer 150, second layer 130, and/or first layer 120 may include substantially similar or substantially varied material compositions.

Figure 14:
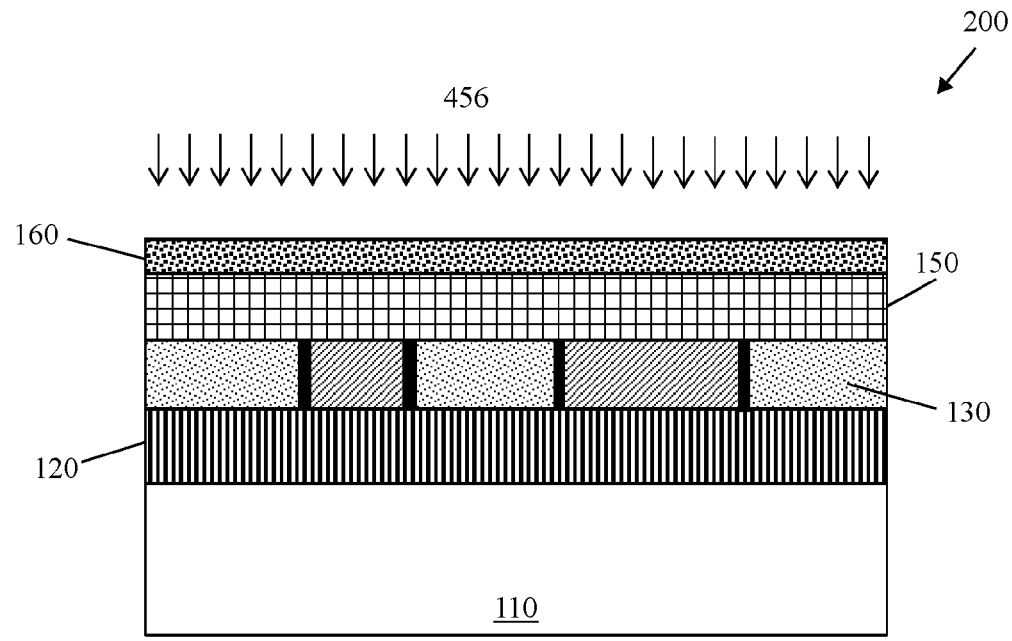
Figure 15:
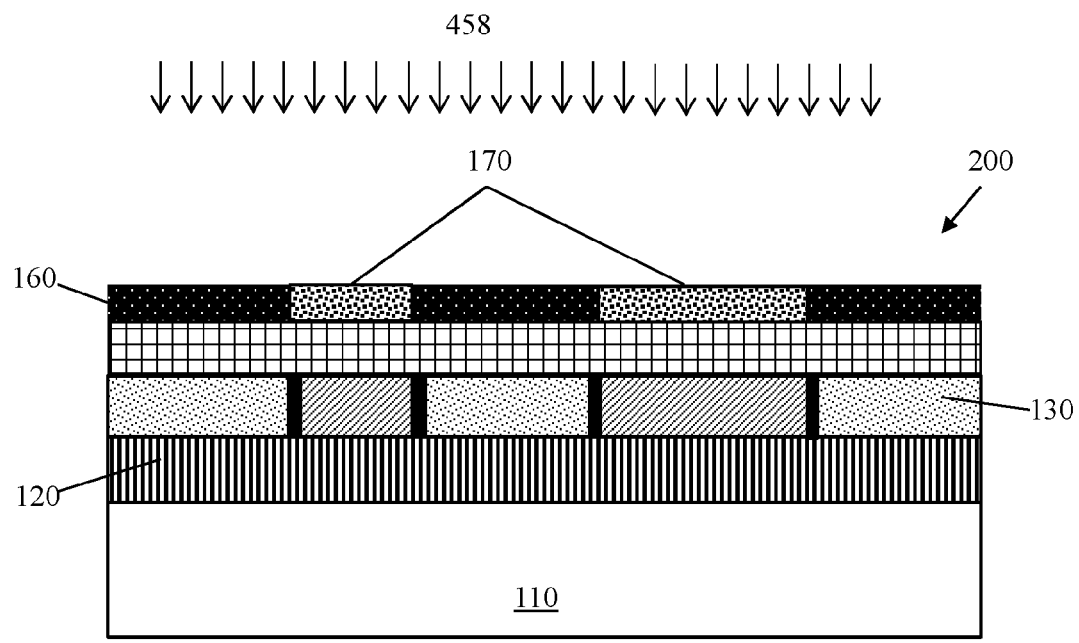

Turning to FIG. 14, an illustration of a semiconductor layer 170 (e.g., silicon) being disposed on third layer 150 is shown according to embodiments of the invention. Semiconductor layer 170 may be deposited and/or grown on third layer 150 and may include silicon. In an embodiment, semiconductor layer 170 may include materials consistent with set of back-gate bias lines 140. Next, in FIG. 15, an illustration of semiconductor layer 170 being subjected to a patterning process 458 (e.g., a shallow trench isolation process, etc.) to form/shape a set of STIs 160 is shown in accordance with embodiments of the invention. Process 458 may form/shape/locate set of STIs 160 between portions of semiconductor layer 170.

Figure 16:
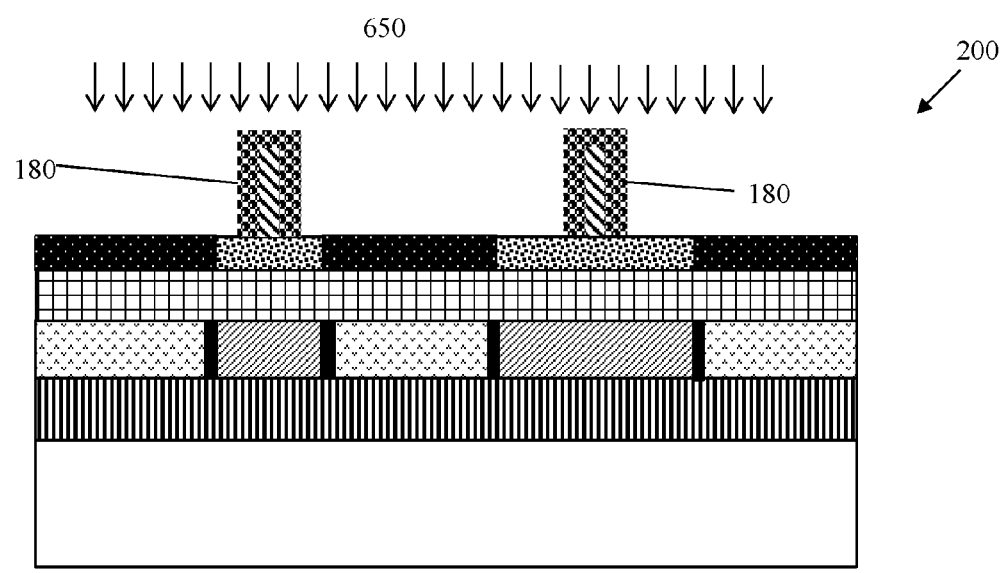

Turning to FIG. 16, an illustration of semiconductor device 200 being subjected to a set of formation processes 650 which may form a set of devices 180 (e.g., transistors, field effect transistors, etc.) on portions of semiconductor layer 170 proximate to set of STIs 160 is shown according to embodiments. Once formation of set of STIs 160 has stopped, a series of device formation processes 650 (e.g., FET formation) may develop devices on semiconductor device 200.

Figure 17:
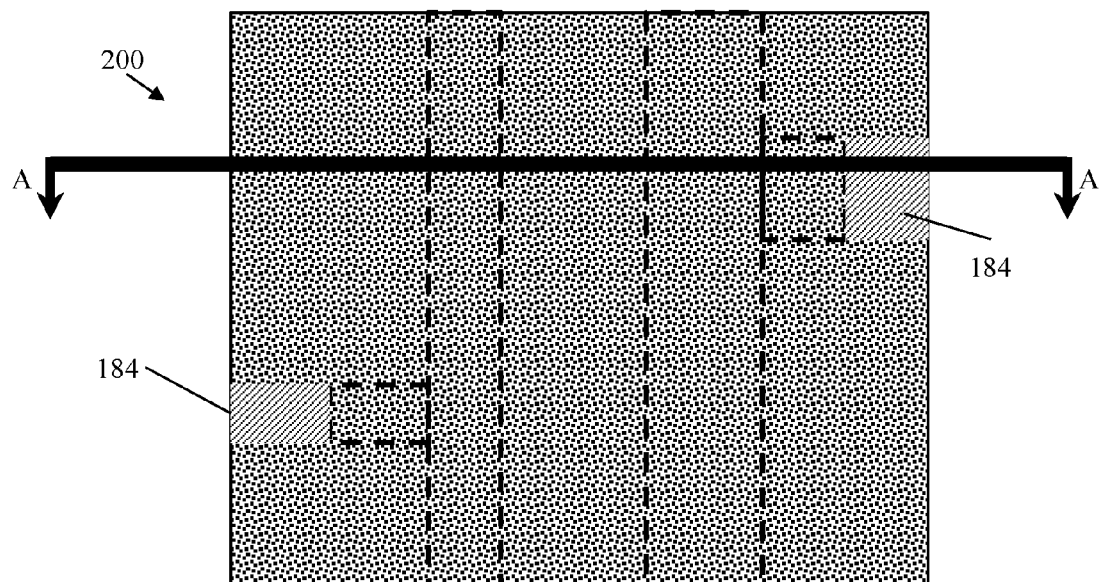
Figure 18:
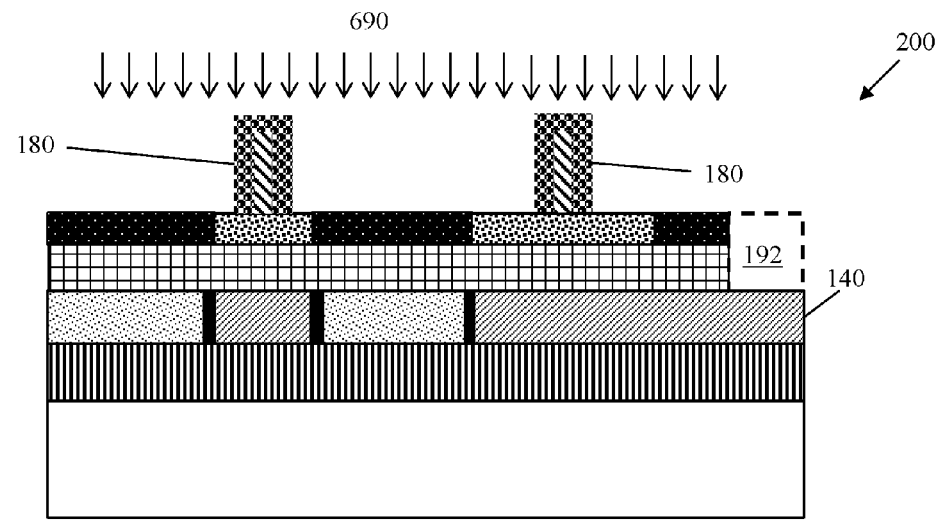

Turning to FIGS. 17-18, embodiments of portions of a wafer and semiconductor device 200 are shown in accordance with embodiments of the disclosure. FIG. 17 shows a top view of portions of semiconductor device 200. FIG. 18 shows a cross-sectional view of portions of semiconductor device 200 along line A-A in FIG. 17.

Referring to FIG. 17, an illustration of a top view of semiconductor device 200 being subjected to an opening process 690 (shown in FIG. 18) to access a set of contacts 184 of set of back-gate bias lines 140 following set of formation processes 650 is shown according to embodiments of the invention. In an embodiment, an etch may be performed through portions of semiconductor layer 160, set of STIs 160 and/or portions of third layer 150 to access/contact/connect to back-gate bias lines 140 (shown in phantom) through a set of contacts 184. As can be seen in the cross-sectional illustration of FIG. 18, opening process 690 creates an aperture/notch 192 (shown in phantom) through STI 160 and third dielectric layer 150. Aperture 192 allows for direct access/connection to a back-gate bias line 140.

Turning to FIG. 19, an illustration of a cross sectional view of an alternative embodiment of a semiconductor device 700 including a set of back-gate bias lines 740 is shown according to embodiments. Semiconductor device 700 includes a substrate 710 with a first crystalline dielectric layer 720 disposed on a surface thereof. A second crystalline dielectric layer 730 is disposed on first layer 720, beneath a third crystalline dielectric layer 750, and between set of back-gate bias lines 740. A semiconductor layer 770 and a set of STIs 760 may be formed on third layer 750 and a set of devices 780 may be formed on semiconductor layer 770 over set of back-gate bias lines 740. In an embodiment, set of back-gate bias lines 740 may include a first back-gate bias line 742 which includes a first material (e.g., silicon germanium, silicon, carbon doped silicon, p-type, n-type, etc.), and a second back-gate bias line 744 which includes a second material (e.g., silicon germanium, silicon, carbon doped silicon, p-type, n-type, etc.) which is different from the first material. In one embodiment, first back-gate bias line 742 may be p-doped and second back-gate bias line 744 may be n-doped.

Figure 20:
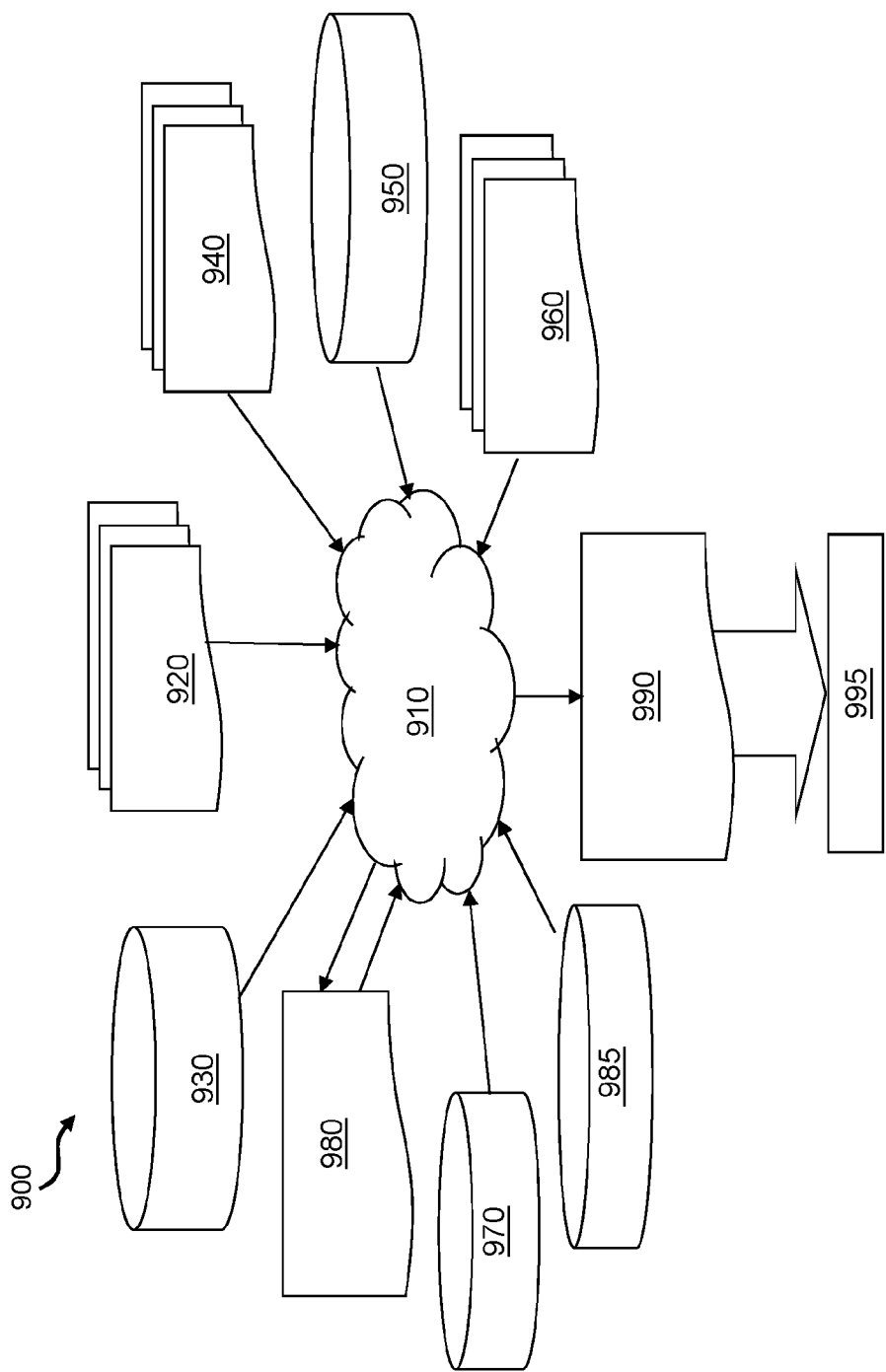
FIG. 20 is an illustration of a flow diagram of a design process used in semiconductor design, manufacture, and/or test according to embodiments of the invention.

FIG. 20 shows an illustration of a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, graphically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 20 illustrates multiple such design structures (e.g., textual representations, graphical representations, data structural representations, etc.) including an input design structure 920 that is preferably processed by a design process 910. Design structure 920 may be a logical simulation design structure generated and processed by design process 910 to produce a logically equivalent functional representation of a hardware device, and may include a text or a graphical representation. Design structure 920 may include at least one of a textual representation, a graphical representation, and a data structural representation of an integrated circuit and/or components thereof. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit or semiconductor design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 990 may comprise a compiled, executable HDL simulation model that functionally simulates the devices shown in FIG. 1.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor device comprising:
a first dielectric layer disposed on a substrate;
a set of bias lines disposed on the first dielectric layer;
a second dielectric layer disposed on the first dielectric layer and between the set of bias lines, wherein a thickness of the second dielectric layer is less than a thickness of the first dielectric layer;
a third dielectric layer disposed on the second dielectric layer and the set of bias lines, wherein a thickness of the third dielectric layer is less than the thickness of the first dielectric layer;
a patterned semiconductor layer disposed on portions of the third dielectric layer; and
a set of devices disposed on the patterned semiconductor layer above the set of bias lines, wherein each of the substrate, the first dielectric layer, the second dielectric layer, the third dielectric layer, and the set of bias lines have a same crystallographic orientation.

2. The semiconductor device of claim 1, wherein the set of devices includes a transistor.

3. The semiconductor device of claim 1, wherein the set of bias lines includes:
a first bias line with a first back-gate bias; and
a second bias line with a second back-gate bias.

4. The semiconductor device of claim 1, further comprising a set of oxide spacers disposed between the set of bias lines and the second dielectric layer.

5. The semiconductor device of claim 1, wherein at least one of the first dielectric layer, the second dielectric layer, and the third dielectric layer includes a rare earth oxide (REO).

6. The semiconductor device of claim 1, wherein third dielectric layer and the patterned semiconductor layer have the same crystallographic orientation.

7. A semiconductor device comprising:
a first dielectric layer positioned on a substrate,
a set of bias lines positioned on the first dielectric layer, the set of bias lines including: a first bias line having a first back-gate bias, and a second bias line having a second back-gate bias;
a second dielectric layer positioned on the first dielectric layer and between the set of bias lines, wherein an upper surface of the set of bias lines is substantially coplanar with an upper surface of the second dielectric layer;
a third dielectric layer positioned on each of the second dielectric layer and the set of bias lines, wherein a thickness of the third dielectric layer is less than a thickness of the first dielectric layer, wherein each of the substrate, the first dielectric layer, the second dielectric layer, the third dielectric layer, and the set of bias lines have a same crystallographic orientation;
a semiconductor layer positioned on the third dielectric layer; and
a set of devices positioned on the semiconductor layer, wherein the set of devices includes a first transistor disposed above the first bias line and a second transistor disposed above the second bias line.

8. The semiconductor device of claim 7, wherein at least one of the first dielectric layer, the second dielectric layer, and the third dielectric layer includes a rare earth oxide (REO).

9. The semiconductor device of claim 7, wherein each of the first, second, and third dielectric layers includes an epitaxial oxide compound.

10. The semiconductor device of claim 7, wherein the first bias line is doped oppositely from the second bias line.

11. The semiconductor device of claim 7, wherein third dielectric layer and the patterned semiconductor layer have the same crystallographic orientation.

12. A semiconductor device comprising:
a first dielectric layer positioned on a substrate and having a thickness between approximately 10 nanometers (nm) and approximately 100 nm,
a set of bias lines positioned on the first dielectric layer, the set of bias lines including: a first bias line having a first back-gate bias, and a second bias line having a second back-gate bias;
a second dielectric layer positioned on the first dielectric layer and between the set of bias lines and having a thickness between approximately 10 nm and approximately 30 nm, wherein an upper surface of the set of bias lines is substantially coplanar with an upper surface of the second dielectric layer, and wherein a thickness of the second dielectric layer is less than a thickness of the first dielectric layer;
a third dielectric layer positioned on each of the second dielectric layer and the set of bias lines and having a thickness between approximately 10 nm and approximately 30 nm, wherein a thickness of the third dielectric layer is less than a thickness of the first dielectric layer, wherein each of the substrate, the first dielectric layer, the second dielectric layer, the third dielectric layer, and the set of bias lines have a same crystallographic orientation;
a semiconductor layer positioned on the third dielectric layer; and
a set of devices positioned on the semiconductor layer, wherein the set of devices includes a first transistor disposed above the first bias line and a second transistor disposed above the second bias line.

13. The semiconductor device of claim 12, wherein each of the first, second, and third dielectric layers includes an epitaxial oxide compound.

14. The semiconductor device of claim 12, wherein the each of the first, second, and third dielectric layers includes a rare earth oxide (REO).

15. The semiconductor device of claim 12, wherein a material composition of the first bias line is different form a material composition of the second bias line.

16. The semiconductor device of claim 12, further comprising a set of oxide spacers disposed between the set of bias lines and the second dielectric layer.

17. The semiconductor device of claim 12, wherein the patterned semiconductor layer and the third dielectric layer have the same crystallographic orientation.

* * * * *